(12) United States Patent
Zhu et al.

(10) Patent No.: US 10,128,375 B2
(45) Date of Patent: Nov. 13, 2018

(54) STRAINED FINFET AND METHOD FOR MANUFACTURING THE SAME

(75) Inventors: Huilong Zhu, Poughkeepsie, NY (US); Miao Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/419,833

(22) PCT Filed: Aug. 24, 2012

(86) PCT No.: PCT/CN2012/080547
§ 371 (c)(1),
(2), (4) Date: Feb. 5, 2015

(87) PCT Pub. No.: WO2014/023047
PCT Pub. Date: Feb. 13, 2014

(65) Prior Publication Data
US 2015/0221769 A1    Aug. 6, 2015

(30) Foreign Application Priority Data
Aug. 10, 2012   (CN) .......................... 2012 1 0285604

(51) Int. Cl.
*H01L 21/00* (2006.01)
*H01L 29/78* (2006.01)
(Continued)

(52) U.S. Cl.
CPC ........ *H01L 29/7849* (2013.01); *H01L 21/308* (2013.01); *H01L 21/3065* (2013.01);
(Continued)

(58) Field of Classification Search
CPC ............. H01L 29/66795; H01L 29/785; H01L 29/1054; H01L 21/823431
See application file for complete search history.

(56) References Cited

U.S. PATENT DOCUMENTS 6,413,802 B1   7/2002  Hu et al.
6,855,990 B2   2/2005  Yeo et al.
(Continued)

FOREIGN PATENT DOCUMENTS

CN          1503372 A      6/2004
CN         101228634 A     7/2008
WO      WO-2014023047 A1   2/2014

OTHER PUBLICATIONS

"International Application Serial No. PCT/CN2012/080547, International Search Report dated May 23, 2013".
(Continued)

*Primary Examiner* — William Harriston
(74) *Attorney, Agent, or Firm* — Schwegman Lundberg & Woessner, P.A.

(57) ABSTRACT

An FinFET and a method for manufacturing the same are disclosed. The FinFET comprises: a semiconductor substrate; a stress layer on the semiconductor substrate; a semiconductor fin on the stress layer, the semiconductor fin having two sidewalls extending in its length direction; a gate dielectric on the sidewalls of the semiconductor fin; a gate conductor on the gate dielectric; and a source region and a drain region at two ends of the semiconductor fin, wherein the stress layer extends below and in parallel with the semiconductor fin, and applies stress to the semiconductor fin in the length direction of the semiconductor fin.

18 Claims, 14 Drawing Sheets

(51) Int. Cl.
*H01L 29/10* (2006.01)
*H01L 21/3065* (2006.01)
*H01L 21/308* (2006.01)
*H01L 29/06* (2006.01)
*H01L 29/161* (2006.01)
*H01L 29/66* (2006.01)
*H01L 29/165* (2006.01)

(52) U.S. Cl.
CPC ...... *H01L 29/0611* (2013.01); *H01L 29/0649* (2013.01); *H01L 29/1054* (2013.01); *H01L 29/161* (2013.01); *H01L 29/165* (2013.01); *H01L 29/66795* (2013.01); *H01L 29/785* (2013.01); *H01L 29/7846* (2013.01)

(56) References Cited

U.S. PATENT DOCUMENTS

| | | | |
|---|---|---|---|
| 6,888,181 B1 | 5/2005 | Liao et al. | |
| 7,855,105 B1 * | 12/2010 | Jagannathan | H01L 21/823431 257/E21.629 |
| 8,338,259 B2 * | 12/2012 | Wu | H01L 29/165 257/288 |
| 8,492,235 B2 * | 7/2013 | Toh | H01L 29/66795 257/E29.022 |
| 8,637,372 B2 * | 1/2014 | Liu | H01L 21/3065 257/E21.19 |
| 8,786,004 B2 * | 7/2014 | Park | H01L 27/11565 257/314 |
| 8,928,086 B2 * | 1/2015 | Utomo | H01L 29/7855 257/365 |
| 8,962,400 B2 * | 2/2015 | Tsai | H01L 21/823807 438/157 |
| 8,987,794 B2 * | 3/2015 | Rachmady | H01L 29/42392 257/288 |
| 9,577,101 B2 * | 2/2017 | Ching | H01L 29/7851 |
| 2004/0150029 A1 | 8/2004 | Lee | |
| 2005/0077510 A1 * | 4/2005 | Chu | H01L 29/7782 257/19 |
| 2008/0073667 A1 * | 3/2008 | Lochtefeld | H01L 29/66795 257/190 |
| 2008/0237636 A1 * | 10/2008 | Jin | H01L 29/1054 257/190 |
| 2010/0248454 A1 * | 9/2010 | Maszara | H01L 29/66795 438/478 |
| 2011/0180847 A1 * | 7/2011 | Ikeda | H01L 29/045 257/190 |
| 2012/0319211 A1 * | 12/2012 | van Dal | H01L 29/785 257/401 |
| 2013/0005103 A1 * | 1/2013 | Liu | H01L 21/3065 438/285 |
| 2013/0011983 A1 * | 1/2013 | Tsai | H01L 21/823807 438/285 |
| 2017/0047432 A1 * | 2/2017 | Ching | H01L 29/785 |
| 2017/0133508 A1 * | 5/2017 | Ching | H01L 29/7851 |

OTHER PUBLICATIONS

"International Application Serial No. PCT/CN2012/080547, International Report on Patentability dated Feb. 10, 2015", W/ English Translation, 13 pgs.
"International Application Serial No. PCT/CN2012/080547, Written Opinion dated May 10, 2013", W/ English Translation, 12 pgs.
"Chinese Application Serial No. 201210285604.6, First Office Action dated Sep. 1, 2015", (w/ English Translation), 15 pgs.

* cited by examiner

STRAINED FINFET AND METHOD FOR MANUFACTURING THE SAME

CROSS-REFERENCE TO RELATED APPLICATION(S)

This application is a U.S. National Stage Filing Under 35 U.S.C. 371 from International Application No. PCT/CN2012/080547, filed 24 Aug. 2012, which application claims the benefit of priority to the Chinese Patent Application No. 201210285604.6, filed on Aug. 10, 2012, which applications and publication are incorporated herein by reference in their entirety.

TECHNICAL FIELD

The present disclosure relates to semiconductor technology, and in particular, to strained FinFETs and methods for manufacturing the same.

BACKGROUND

An important trend in development of semiconductor technology is scaling down of metal-oxide-semiconductor field effect transistors (MOSFETs) for improving integration level and reducing manufacturing cost. However, it is well known that short channel effects arise as the size of MOSFETs decreases. When the size of the MOSFET is scaled down, a gate of the MOSFET has a smaller effective length and actually controls fewer charges in a depletion region when a gate voltage is applied. Consequently, the MOSFET has a reduced threshold voltage with a reduced channel length.

To suppress the short channel effect, U.S. Pat. No. 6,413,802 discloses a FinFET formed on a SOI substrate, comprising a channel region provided in a central portion of a fin of semiconductive material and source/drain regions provided at two ends of the fin. A gate electrode is provided at both sides of the channel region and surrounds the latter to provide, for example, a double-gate FinFET, in which inversion layers are created at the sides of the channel. The channel region in the fin has a small thickness so that the whole channel region is controlled by the gate, as a result of which, the short channel effect is suppressed.

It is also known that mobility of carriers can be increased by applying a suitable stress to a channel region of the MOSFET, which in turn reduces on-state resistance and increases a switching speed of the device. However, it is difficult in the FinFET to apply the suitable stress to the channel region in a direction between a source region and a drain region. In other words, the strained FinFET is still a challenge.

SUMMARY OF THE DISCLOSURE

In the present disclosure, a strained FinFET having improved device performances is provided.

According to one aspect of the present disclosure, there is provided a method for manufacturing a FinFET, comprising: forming a stress layer on a semiconductor substrate; forming a semiconductor layer on the stress layer; forming a semiconductor fin from the semiconductor layer, the semiconductor fin having two sidewalls extending in its length direction; forming a gate dielectric on the sidewalls of the semiconductor fin; forming a gate conductor on the gate dielectric so that the gate dielectric is sandwiched between the gate conductor and the semiconductor fin; and forming a source region and a drain region at two ends of the semiconductor fin, wherein the stress layer extends below and in parallel with the semiconductor fin, and applies stress to the semiconductor fin in the length direction of the semiconductor fin.

A FinFET and a method for manufacturing the same are disclosed. The FinFET comprises: a semiconductor substrate; a stress layer on the semiconductor substrate; a semiconductor fin on the stress layer, the semiconductor fin having two sidewalls extending in its length direction; a gate dielectric on the sidewalls of the semiconductor fin; a gate conductor on the gate dielectric; and a source region and a drain region at two ends of the semiconductor fin, wherein the stress layer extends below and in parallel with the semiconductor fin, and applies stress to the semiconductor fin in the length direction of the semiconductor fin.

Preferably, the stress layer may have a first dimension in the length direction of the semiconductor fin and a second dimension in a width direction of the semiconductor fin, and the first dimension is larger than the second dimension.

Preferably, the second dimension of the stress layer may be larger than the width of the semiconductor fin.

Preferably, between the step of forming the gate dielectric and the step of forming the gate conductor, or between the step of forming the semiconductor layer and the step of forming the semiconductor fin, a shallow trench isolation may be formed. The shallow trench isolation defines an active region of the FinFET and the first dimension of the stress layer. The stress layer has two ends adjoining the shallow trench isolation in the length direction of the semiconductor fin.

The FinFET according to the present comprises a stress layer, which applies stress to a semiconductor fin in a length direction of the semiconductor fin, and increases mobility of charge carriers, which in turn reduces on-state resistance and increases a switching speed of the device.

DETAILED DESCRIPTION

Figure 1:
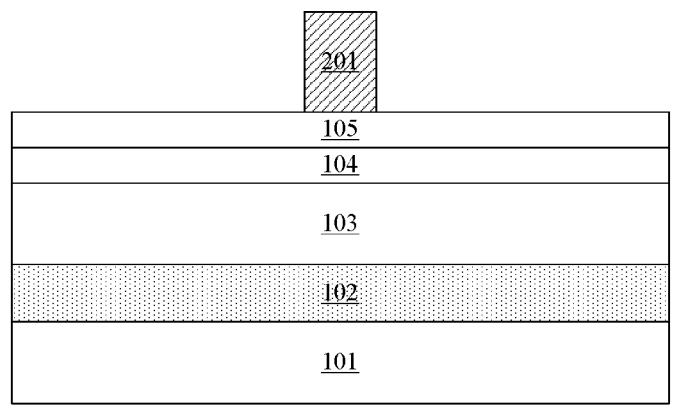
FIGS. 1 to 6 are cross-sectional views of semiconductor structures at some stages of a method of manufacturing a FinFET according to one embodiment of the present disclosure.

Exemplary embodiments of the present disclosure will be described in more details below with reference to the accompanying drawings. In the drawings, like reference numerals denote like members. The figures are not drawn to scale for the sake of clarity.

For simplicity, the structure of the semiconductor device having been subject to several relevant processing steps may be shown in one figure.

It should be understood that when one layer or region is referred to as being "above" or "on" another layer or region in the description of a device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" or "adjoin" another layer or region, there are not intervening layers or regions present.

In the present application, the phrase "semiconductor structure" generally means the whole semiconductor structure formed at each step of the method for manufacturing the semiconductor device, including all of the layers and regions having been formed. The phrase "without an additional photoresist mask being used" means that the photoresist mask is only optional, and only an example in which no additional photoresist mask is used is illustrated here. Nevertheless, the relevant step can be performed with an additional photoresist mask being used, though it makes the manufacture process more complicate.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential but can be varied in a specific implementation of the disclosure.

Unless otherwise indicated in the context, each part of the FinFET can be made of material(s) well known to one skilled person in the art. A semiconductor substrate and a semiconductor layer may be made of any semiconductive material, such as a group III-V semiconductor, for example, GaAs, InP, GaN, or SiC, or a group IV semiconductor, for example, Si or Ge. A gate conductor may be made of any conductive material, such as metals, doped polysilicon, and a stack of metals and doped polysilicon, among others. For example, the gate conductor may be made of one selected from a group consisting of TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, $Ni_3Si$, Pt, Ru, Ir, Mo, HfRu, RuOx, and their combinations. A gate dielectric is made of $SiO_2$ or other dielectric insulation material which has a dielectric constant larger than that of $SiO_2$, such as an oxide, a nitride, an oxynitride, a silicate, an aluminate, and a titanate. The oxide includes, for example, $SiO_2$, $HfO_2$, $ZrO_2$, $Al_2O_3$, $TiO_2$, or $La_2O_3$. The nitride includes, for example, $Si_3N_4$. The silicate includes, for example, HfSiOx. The aluminate includes, for example, $LaAlO_3$. The titanate includes, for example, $SrTiO_3$. The oxynitride includes, for example, SiON. Moreover, the gate dielectric layer may be made of those developed in the future, besides the above known materials.

According to one embodiment of the present disclosure, a strained FinFET is formed by performing the steps shown in FIGS. 1 to 11 which show cross-sectional views of semiconductor structures at various stages of the manufacture process.

As shown in FIG. 1, a stress layer (for example, SiGe) 102 and a semiconductor layer (for example, Si) 103 are formed sequentially on a semiconductor substrate (for example, bulk silicon) 101 by conventional deposition processes, such as electron-beam evaporation (EBM), chemical vapor deposition (CVD), atomic layer deposition (ALD), sputtering, or the like. For example, the stress layer 102 may be an epitaxially-grown SiGe layer with a content of Ge of 5-10% by weight and with a thickness of about 10-50 nm. The semiconductor layer 103 may be an epitaxially-grown Si layer with a thickness of about 20-150 nm. The semiconductor layer 103 is to be formed as a fin of the FinFET.

An oxide liner (for example, silicon oxide) 104 and a nitride liner (for example, silicon nitride) are further formed on the semiconductor layer 103. As an example, the oxide liner 104 may be formed by thermal oxidization, and the nitride liner 105 may be formed by CVD. The nitride liner 104 releases stress which is otherwise introduced between the semiconductor substrate 101 and the oxide liner 105, and, for example, may have a thickness of about 2-5 nm. The oxide liner 105 is to be used as a stop layer in a subsequent chemical mechanical polishing (CMP) process, and, for example, may have a thickness of about 10-50 nm.

A photoresist layer 201 is then formed on the surface of the oxide liner 105 by spin coating, and then patterned into a stripe pattern by a lithography process including exposure and development.

With the photoresist layer 201 as a mask, exposed portions of the nitride liner 105 and the oxide liner 104 are removed from top to bottom by a dry etching process, such as ion beam milling, plasma etching, reactive ion etching, and laser ablation, or by a wet etching process in which a solution of etchant is used. The etching stops at the surface of the semiconductor layer 103. The remaining portions of the nitride liner 105 and the oxide liner 104 are together to be used as a hard mask when forming the fin and as a protection layer after forming the fin in subsequent steps.

As an example, the hard mask may be formed by a two-step reactive ion etching process, in which the exposed portion of the nitride liner 105 may be firstly removed using an etchant that etches a nitride with respect to an oxide and the exposed portion of the oxide liner 104 may then be removed using an etchant that etches the oxide with respect to the nitride.

Figure 2:
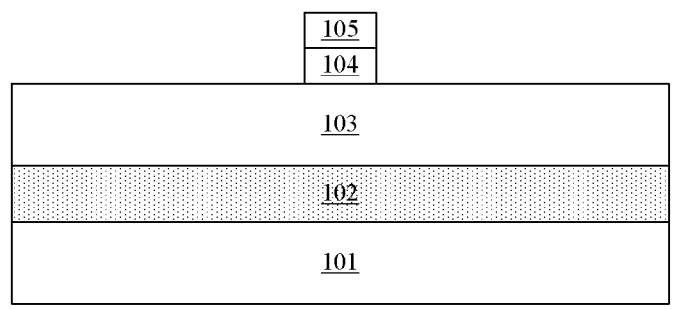

After the above etching steps, the photoresist layer 201 is removed by ashing or dissolution with a solvent, as shown in FIG. 2.

Figure 3:
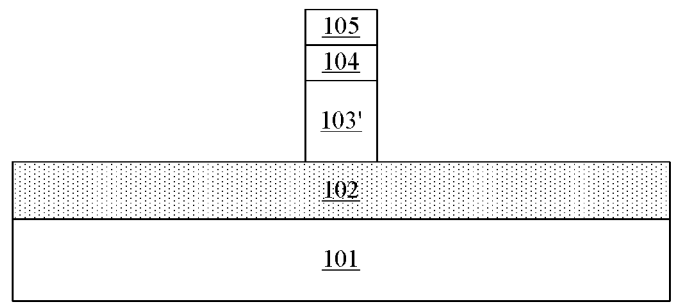

With the nitride liner 105 and the oxide liner 104 together as a hard mask, an exposed portion of the semiconductor layer 103 is removed by the above conventional dry etching process or the above conventional wet etching process. Due to selectivity of an etchant, the etching stops at the surface of the stress layer 102. A fin 103' is formed by the remaining portion of the semiconductor layer 103, as shown in FIG. 3.

A length direction of the fin 103' is perpendicular to the paper sheet. A channel width of the FinFET to be formed is determined by the thickness of the fin 103' (i. e. the thickness of the semiconductor layer 103). Thus, the channel width of the FinFET may be well controlled by controlling the thickness of the semiconductor layer 103.

As an example, the semiconductor layer 103 may be made of Si, and the stress layer 102 may be made of SiGe. As another example, the semiconductor layer 103 may be made of Si, and the stress layer 102 may be made of Si:C. The semiconductor layer 103 is formed as the fin 103' by reactive ion etching using an etchant that etches the semiconductor layer 103 with respect to the stress layer 102. It is known in semiconductor manufacture that stress layers, if being made of different materials, can provide tensile stress for improving performances of a p-type MOSFET or compressive stress for improving performances of an n-type MOSFET.

A gate dielectric 106 and a threshold voltage adjustment layer 107 are conformally formed sequentially on the surface of the semiconductor structure by the above conventional deposition process. The gate dielectric 106 and the threshold voltage adjustment layer 107 each includes lateral portions over the nitride liner 105 and the stress layer 102 and vertical portions on sidewalls of the fin 103'. As an example, the gate dielectric 106 may be made of $HfO_2$, and may have a thickness of about 2-5 nm. The threshold voltage adjustment layer 107 may be made of one selected from a group consisting of TaN, TaAlN, TiAlN, and the like, and may have a thickness of about 3-15 nm.

Figure 4:
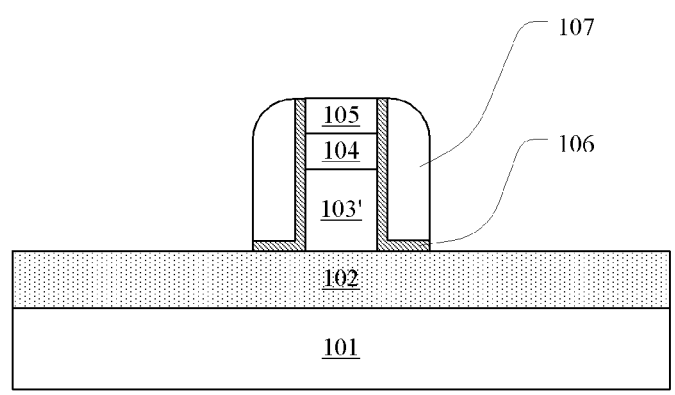

The lateral portion of the threshold voltage adjustment layer 107 is firstly etched away by anisotropic dry etching (for example, reactive ion etching), without a photoresist mask being used. An exposed portion of the gate dielectric 106 is then etched away with the threshold voltage adjustment layer 107 as a hard mask, as shown in FIG. 4.

The threshold voltage adjustment layer 107 is optional, though it is illustrated in this embodiment. In view of the design requirement of the FinFET, the threshold voltage adjustment layer 107 may be included or not included.

Figure 5:
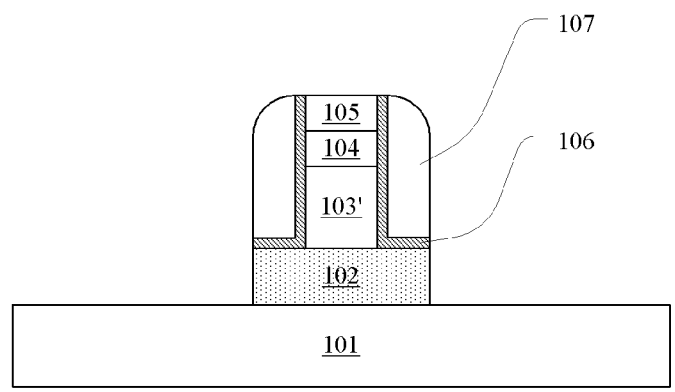

An exposed portion of the stress layer 102 is then removed in a manner self-aligned to the gate dielectric 106 by anisotropic dry etching (for example, reactive ion etching), without a photoresist mask being used. Due to selectivity of an etchant, the etching stops at the surface of the semiconductor substrate 101. The portion of the stress layer 102 that is below the gate dielectric 106, below the threshold voltage adjustment layer 107 and below the nitride liner 105 is kept, as shown in FIG. 5.

Figure 6:
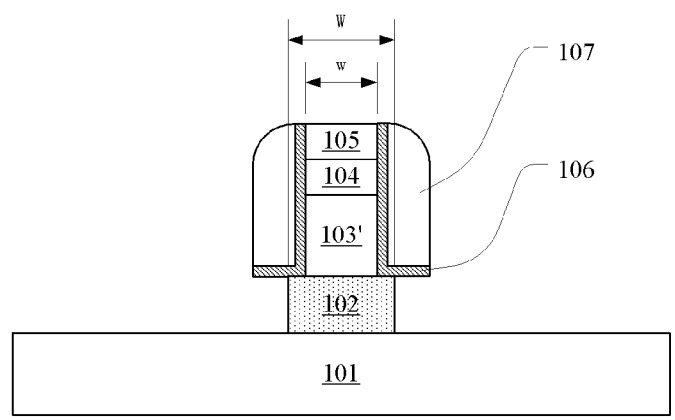

The stress layer 102 is then etched by isotropic dry or wet etching, without an additional photoresist mask being used. Due to selectivity of an etchant, only the stress layer 102 is etched with respect to the underlying semiconductor substrate 101. Moreover, the stress layer 102 is laterally etched from its side surfaces, and an undercut is formed below the gate dielectric 106, as shown in FIG. 6.

By controlling etching time, at least the portion of the stress layer 102 below the fin 103' is kept so that the stress layer 102 is not punched through. As schematically shown in FIG. 6, the remaining portion of the stress layer 102 has a width W which should be larger or equal to a width w of the fin 103', for example, 1×w<W<100×w, so that the stress layer 102 provides sufficient mechanical support for the fin 103'.

After etching, the stress layer 102 extends below and in parallel with the fin 103', and has a dimension in the length direction of the fin 103' much larger than a dimension in the width direction of the fin 103', similar to the fin 103'. After the etching, two side surfaces of the stress layer 102 in the width direction of the fin 103' are also exposed.

A photoresist layer 202 is formed on the surface of the semiconductor structure by spin coating, and then patterned into a pattern of a shallow trench isolation by a lithography process including exposure and development.

Figure 7A:
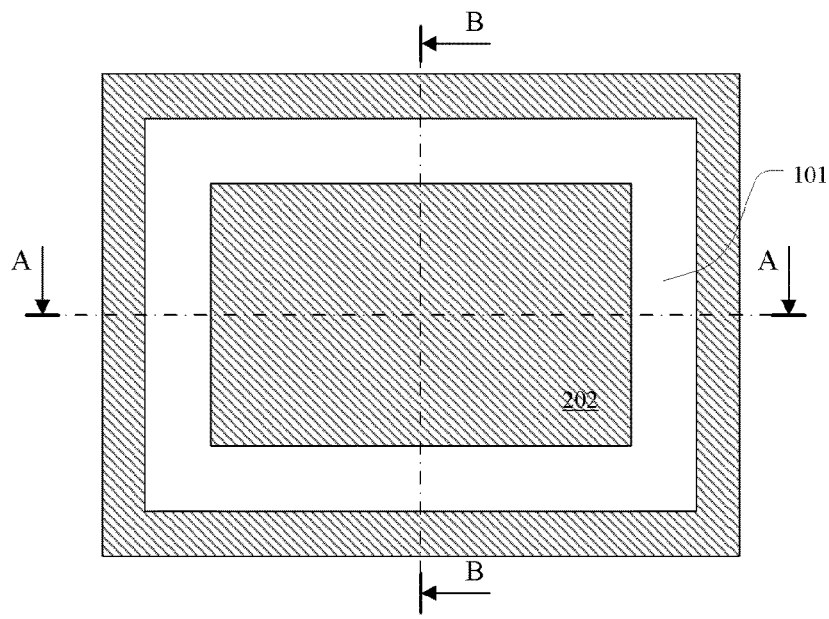
FIGS. 7a, 7b and 7c are a top view and two cross-sectional views taken along different directions of a semiconductor structure at a further stage of the method of manufacturing a FinFET according to one embodiment of the present disclosure.
Figure 7B:
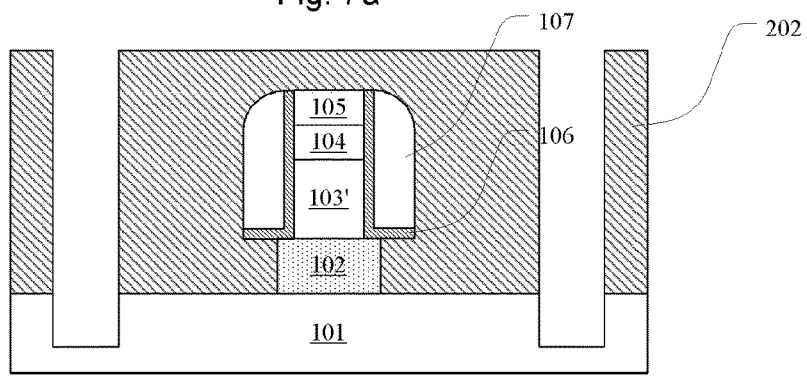
Figure 7C:
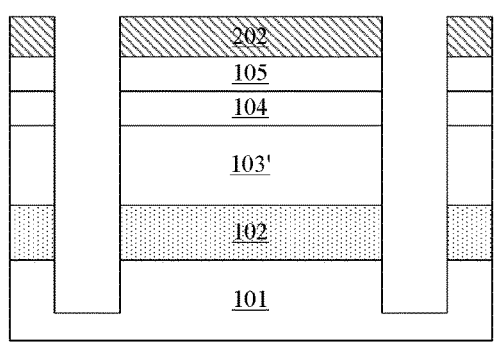

With the photoresist layer 202 as a mask, the shallow trench isolation is formed in the semiconductor substrate 101 by a dry etching process, such as ion beam milling, plasma etching, reactive ion etching, and laser ablation, or by a wet etching process in which a solution of etchant is used, as shown in FIGS. 7a, 7b and 7c. FIG. 7a is a top view of the semiconductor structure after etching. FIG. 7a shows the patterned photoresist layer 202 on the surface of the semiconductor structure, and the bottom of a shallow trench formed in the semiconductor substrate 101 is exposed. FIG. 7b is a cross-sectional view of the semiconductor structure after etching, taken along line A-A' in FIG. 7a (i.e. in a width direction of the fin 103'). FIG. 7c is a cross-sectional view of the semiconductor structure after etching, taken along line B-B' in FIG. 7a (i.e. in a length direction of the fin 103'). It should be noted that only cross-sectional views of the semiconductor structure, taken along line A-A in FIG. 7a (i.e. in a width direction of the fin 103'), are shown for simplicity in the above FIGS. 1 to 6 and will be shown in the following FIGS. 8-11.

As shown in FIG. 7b, the surface of the semiconductor substrate 101 in the width direction of the fin 103' is exposed in an opening in the photoresist layer 202. As a result, the surface of the semiconductor substrate 101 is etched downwards to a predetermined depth. As shown in FIG. 7c, the surface of the nitride liner 105 in a length direction of the fin 103' is exposed in the opening in the photoresist layer 202. As a result, the nitride liner 105, the oxide liner 104, the fin 103' and the stress layer 102 are etched through, and the semiconductor substrate 101 is further etched downwards to a predetermined depth.

Similar to a conventional shallow trench process, after the above steps of forming the shallow trench, a shallow trench (and thus, a shallow trench isolation to be formed) which defines an active region of the FinFET is formed. A source, a drain and a gate of the FinFET will be formed in the region surrounded by the shallow trench. However, two ends of the stress layer 102 in a length direction of the fin 103' are exposed by the shallow trench, which is different from the conventional shallow trench process. The stress layer 102 has a shape similar to a shape of the fin 103', and has free surfaces at two ends in a length direction and at two sides in a width direction. Thus, the stress in the stress layer 102 is released by the shallow trench in the length direction of the fin 103', and in turn tensile or compressive stress is applied to the overlying fin 103' in the length direction of the fin 103'.

Then, the photoresist layer 202 is removed by ashing or dissolution with a solvent. An insulating isolation layer 108 is then formed on the surface of the semiconductor structure by the above conventional deposition process.

Figure 8:
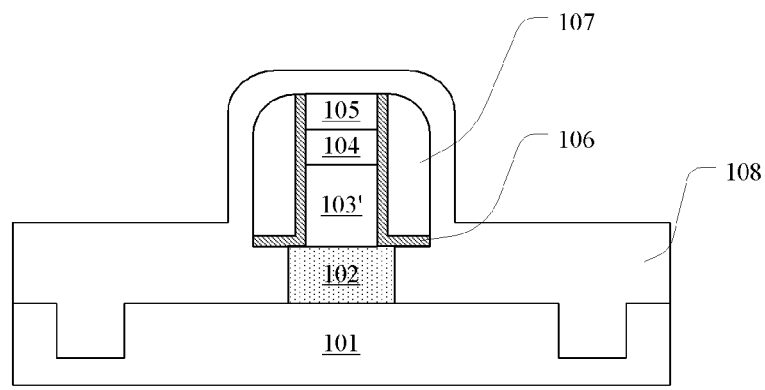
FIGS. 8 to 11 are cross-sectional views of semiconductor structures at some further stages of the method of manufacturing a FinFET according to one embodiment of the present disclosure.

An insulating isolation layer 108 (for example, an oxide) is then formed on the surface of the semiconductor structure by the above conventional deposition process, as shown in FIG. 8. As an example, the insulating isolation layer 108 may be formed by high-density plasma (HDP). The insulating isolation layer 108 includes lateral portions on the semiconductor substrate 101 and on the fin 103', and vertical portions on the threshold voltage adjustment layer 107. Parameters of the deposition process may be selected so that the lateral portions on the semiconductor substrate 101 have thicknesses larger than thicknesses of the lateral portion on the fin 103' and the vertical portions on the threshold voltage adjustment layer 107. A portion of the insulating isolation layer 108 is filled into the shallow trench in the semiconductor substrate 101 so as to form a shallow trench isolation. Moreover, another portion of the insulating isolation layer 108 is filled into the undercut below the gate dielectric 106.

Figure 9:
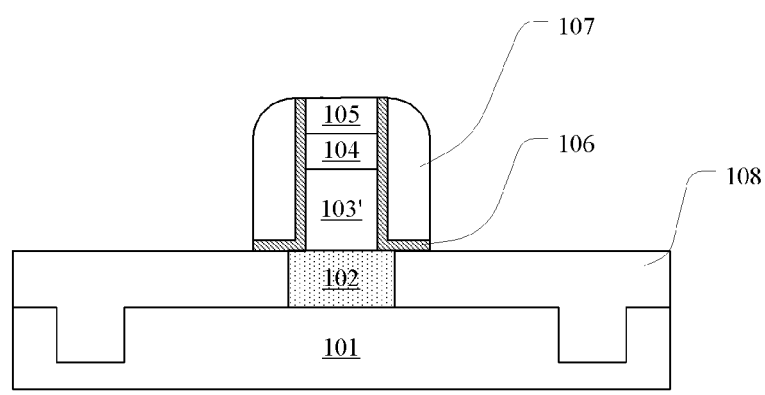

The insulating isolation layer 108 is then etched by isotropic dry or wet etching, without an additional photoresist mask being used, as shown in FIG. 9.

For example, by controlling an etching time, the lateral portion of the insulating isolation layer 108 which extends on the fin 103' and the vertical portion of the insulating isolation layer 108 which extends on the threshold voltage adjustment layer 107 are removed be etching. The threshold voltage adjustment layer 107 is thus exposed. After etching, the lateral portion of the insulating isolation layer 108 on the semiconductor substrate 101 still has a thickness above or equal to the bottom of the gate dielectric 106 so that it is filled into the shallow trench in the semiconductor substrate 101 and into the undercut below the gate dielectric 106.

Figure 10:
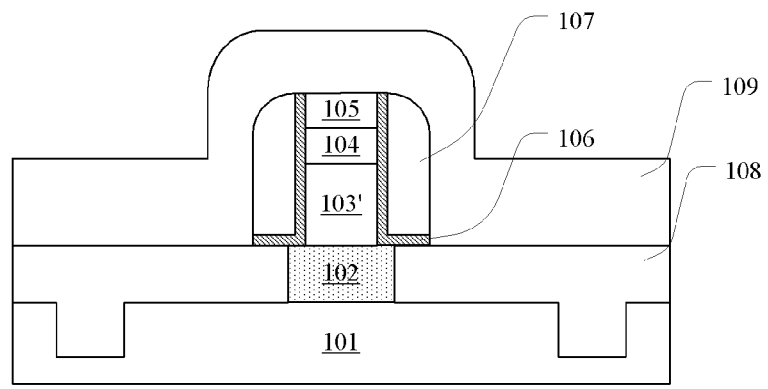
Figure 11:
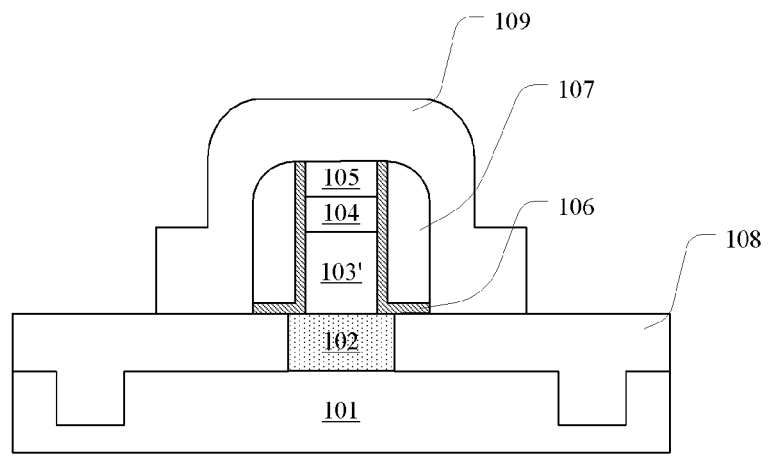

A gate conductor 109 (for example, polysilicon) is then formed on and covers the surface of the semiconductor structure by the above conventional deposition process, as shown in FIG. 10. The gate conductor 109 is patterned through a photoresist mask (not shown) to form a gate pattern extending laterally, as shown in FIG. 11.

An etching step in pattering further removes an exposed portion of the threshold voltage adjustment layer 107 while keeping the remaining portion of the threshold voltage adjustment layer 107 below the gate conductor 109 after the gate conductor 109 has been etched. Alternatively, the etching step in patterning further removes an exposed portion of the gate dielectric 106 while keeping the remaining portion of the gate dielectric 106 below the threshold voltage adjustment layer 107 after the threshold voltage adjustment layer 107 has been etched.

The insulating isolation layer 108 electrically isolates the gate conductor 109 from the semiconductor substrate 101, the stress layer 102 and the fin 103'.

Then, the photoresist mask (not shown) is removed by ashing or dissolution with a solvent.

After the steps shown in FIGS. 1-11, a source/drain implantation is performed on two ends of the fin by a conventional process, followed by a spike anneal at about 1000-1080° C. to activate the implanted ions in the previous implantation process and remedy damages caused by the implantation process, to provide source/drain regions. Other portions of the FinFET are then formed from the resultant semiconductor structure, by subsequent steps of forming an interlayer dielectric layer, forming vias in the interlayer dielectric layer, forming wirings and electrodes on the surface of the interlayer dielectric layer, and the like.

According to another embodiment of the present disclosure, a strained FinFET is formed by performing the steps shown in FIGS. 12 to 23 which show cross-sectional views of semiconductor structures at various stages of the manufacture process.

Similar to the step shown in FIG. 1, a stress layer 102 (for example, SiGe) and a semiconductor layer 103 (for example, Si) are formed successively on a semiconductor substrate 101 (for example, bulk silicon) by conventional deposition processes, followed by an oxide liner 104 (for example, silicon oxide) and a nitride liner 105 (for example, silicon nitride).

A photoresist layer 203 is formed on the surface of the semiconductor structure by spin coating, and then patterned into a pattern of a shallow trench isolation by a lithography process including exposure and development.

Figure 12A:
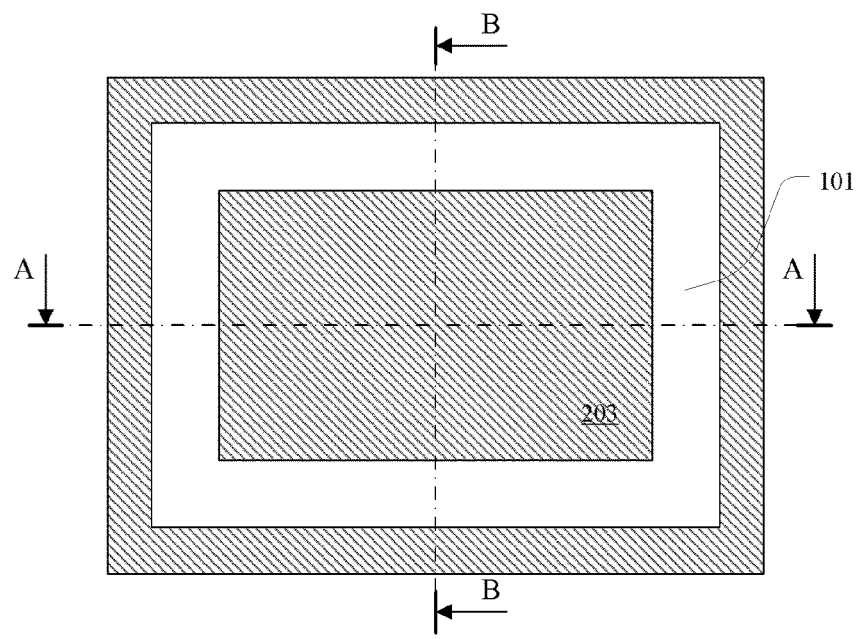
FIGS. 12a, 12b and 12c are a top view and two cross-sectional views taken along different directions of a semiconductor structure at a further stage of the method of manufacturing a FinFET according to another embodiment of the present disclosure.
Figure 12B:
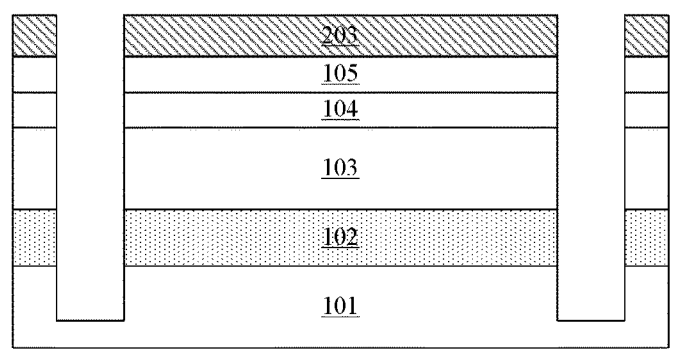
Figure 12C:
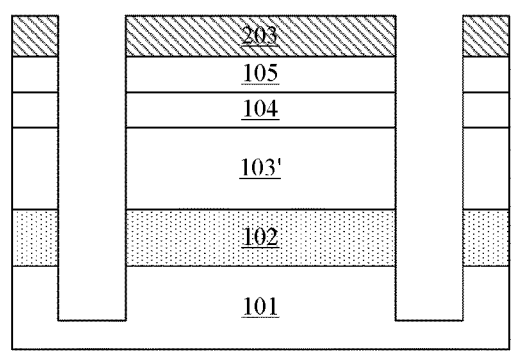

With the photoresist layer 203 as a mask, the shallow trench isolation is formed in the semiconductor substrate 101 by a dry etching process, such as ion beam milling, plasma etching, reactive ion etching, and laser ablation, or by a wet etching process in which a solution of etchant is used, as shown in FIGS. 12a, 12b and 12c. FIG. 12a is a top view of the semiconductor structure after etching, which shows a photoresist layer 203 with a pattern on the surface of the semiconductor structure and the bottom of a shallow trench formed in the semiconductor substrate 101. FIG. 12b is a cross-sectional view of the semiconductor structure after etching, taken along line A-A' in FIG. 12a (i.e. in a width direction of the fin to be formed); and FIG. 12c is a cross-sectional view of the semiconductor structure after etching, taken along line B-B' in FIG. 12a (i.e. in a length direction of the fin to be formed). It should be noted that only cross-sectional views of the semiconductor structure, taken along line A-A in FIG. 12a, are shown for simplicity will be shown in the following FIGS. 13-23.

Similar to a conventional shallow trench process, the above steps of forming the shallow trench provides a shallow trench which defines an active region of the FinFET.

Figure 13:
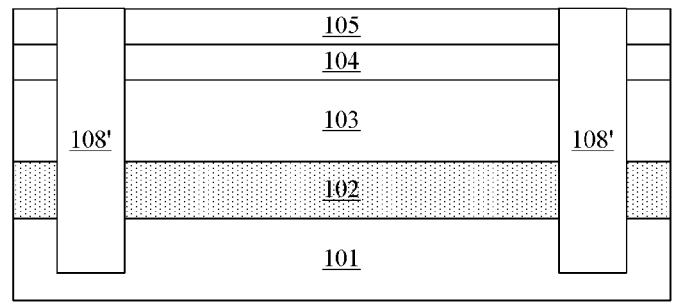
FIGS. 13 to 23 are cross-sectional views of semiconductor structures at some further stages of the method of manufacturing a FinFET according to another embodiment of the present disclosure.

An insulating isolation layer 108' (for example, an oxide) is then formed on the surface of the semiconductor structure by the above conventional deposition process. As an example, the insulating isolation layer 108' may be formed by high-density plasma (HDP). With the nitride liner 105 as a stop layer, the semiconductor structure is subjected to chemical mechanical polishing (CMP) to have a planar surface. The CMP removes the portion of the insulating isolation layer 108' outside the shallow trench. The remaining portion of the insulating isolation layer 108' inside the shallow trench is formed as a shallow trench isolation, as shown in FIG. 13.

Figure 14:
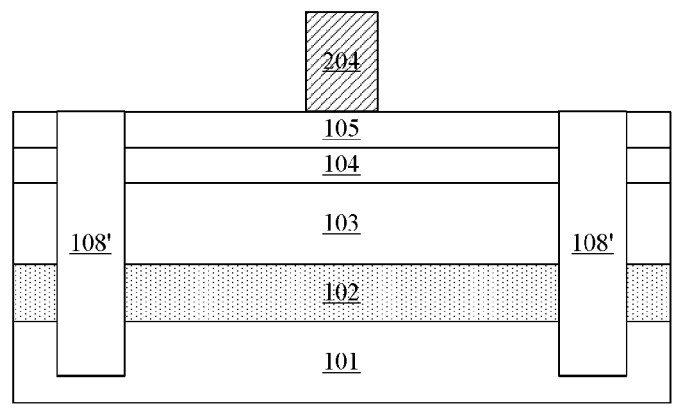

Similar to the step shown in FIG. 1, a photoresist layer 204 with a pattern is formed on the nitride liner 105, as shown in FIG. 14.

Figure 15:
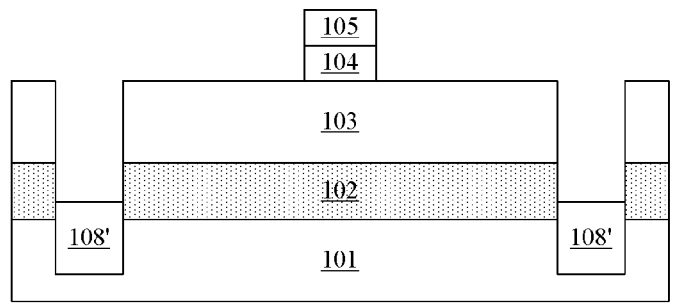

Similar to the step shown in FIG. 2, the nitride liner 105 and the oxide liner 104 are etched with the photoresist layer 201 as a mask, as shown in FIG. 15. The etching removes at least a portion of the insulating isolation layer 108' inside the shallow trench and exposes two ends of the stress layer 102 in a length direction of the fin to be formed. The remaining portions of the nitride liner 105 and the oxide liner 104 are together to be used as a hard mask when forming the fin and as a protection layer after forming the fin in subsequent steps.

Figure 16:
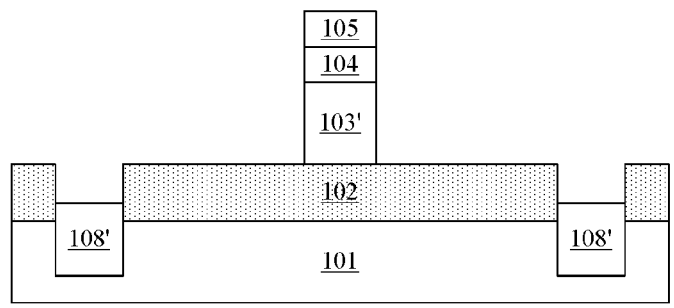

Similar to the step shown in FIG. 3, the semiconductor layer 103 is etched with the nitride liner 105 and the oxide liner 104 together as a hard mask to form a fin 103', as shown in FIG. 16.

Figure 17:
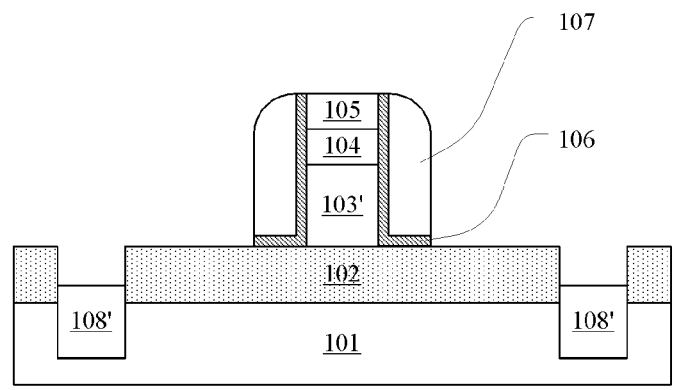

Similar to the step shown in FIG. 4, a gate dielectric 106 and an optional threshold voltage adjustment layer 107 are formed on sidewalls of the semiconductor fin 103', as shown in FIG. 17.

Figure 18:
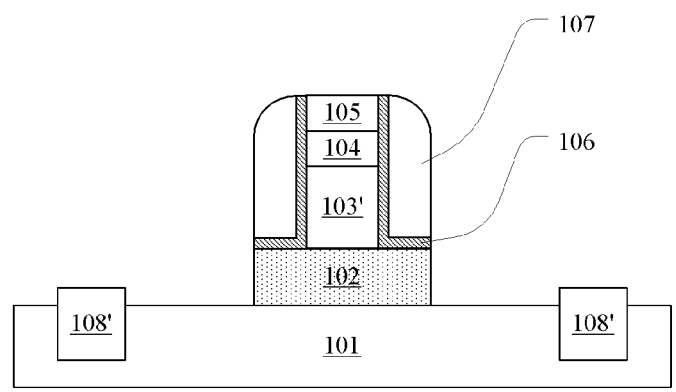

Similar to the step shown in FIG. 5, the stress layer 102 is etched in a manner self-aligned to the gate dielectric 106, as shown in FIG. 18.

Figure 19:
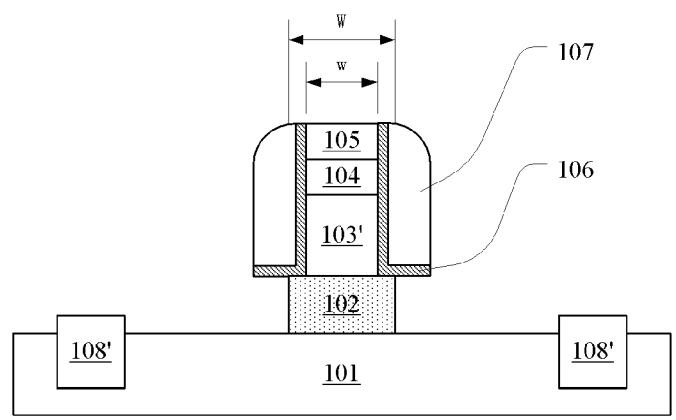

Similar to the step shown in FIG. 6, the stress layer 102 is further etched to form an undercut, as shown in FIG. 19. The etching also exposes two sidewalls of the stress layer 102 in the width direction of the fin 103'. The stress layer 102 has a shape similar to a shape of the fin 103', and has free surfaces at two ends in a length direction and at two sides in a width direction. Thus, the stress in the stress layer 102 is released by the shallow trench in the length direction of the fin 103', and in turn applies tensile or compressive stress to the overlying fin 103' in the length direction of the fin 103'.

Figure 20:
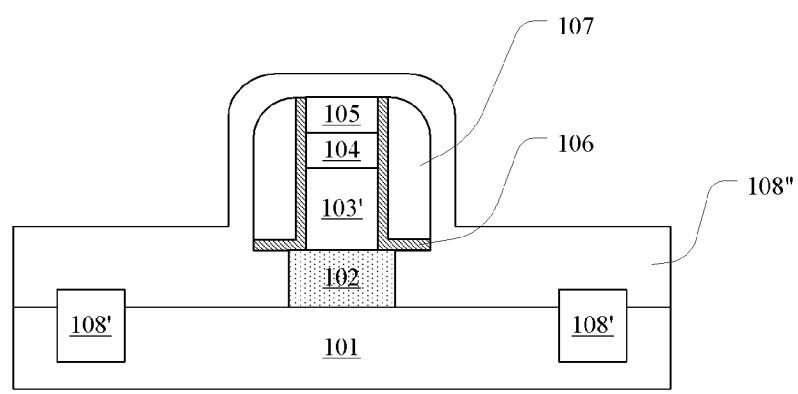

Similar to the step shown in FIG. 8, an insulating isolation layer 108" (for example, an oxide) is then formed on the surface of the semiconductor structure by the above conventional deposition process, as shown in FIG. 20.

Figure 21:
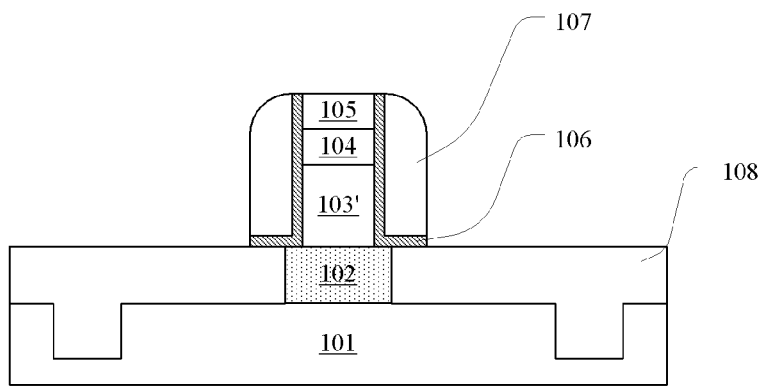

Similar to the step shown in FIG. 9, the insulating isolation layer 108" (for example, an oxide) is etched, as shown in FIG. 21. In FIG. 21, the insulating spacer layer 108" and the insulating isolation layer 108' which is previous formed are generally denoted as an insulating isolation layer 108. After etching, the lateral portion of the insulating isolation layer 108 on the semiconductor substrate 101 still has a thickness above or equal to the bottom of the gate dielectric 106 so that it fills the shallow trench in the semiconductor substrate 101 and the undercut below the gate dielectric 106.

Figure 22:
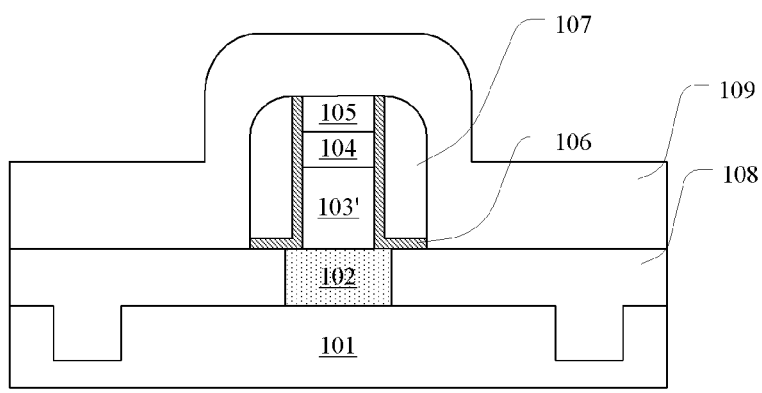
Figure 23:
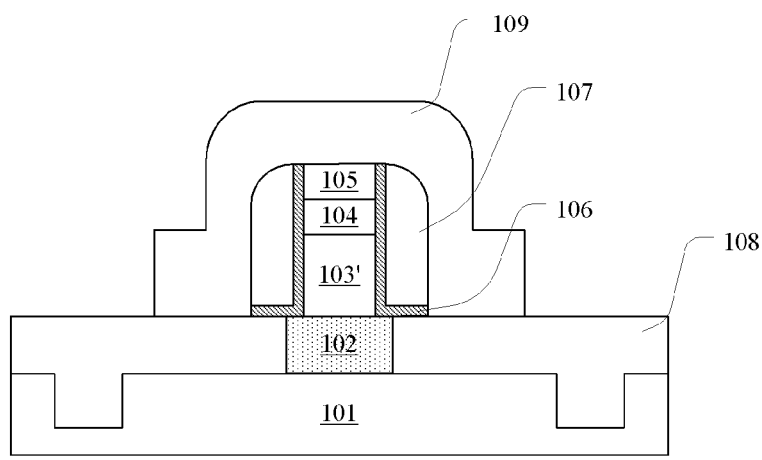

Similar to the step shown in FIGS. 10 and 11, a gate conductor 109 is formed on the gate dielectric 106 and then patterned, as shown in FIGS. 22 and 23.

After the steps shown in FIGS. 12-23, a source/drain implantation is performed on two ends of the fin by a conventional process, followed by a spike anneal at about 1000-1080° C. to activate the implanted ions in the previous implantation process and remedy damages caused by the implantation process, to provide source/drain regions. Other portions of the FinFET are then formed from the resultant semiconductor structure, by subsequent steps of forming an interlayer dielectric layer, forming vias in the interlayer dielectric layer, forming wirings and electrodes on the surface of the interlayer dielectric layer, and the like.

Figure 24:
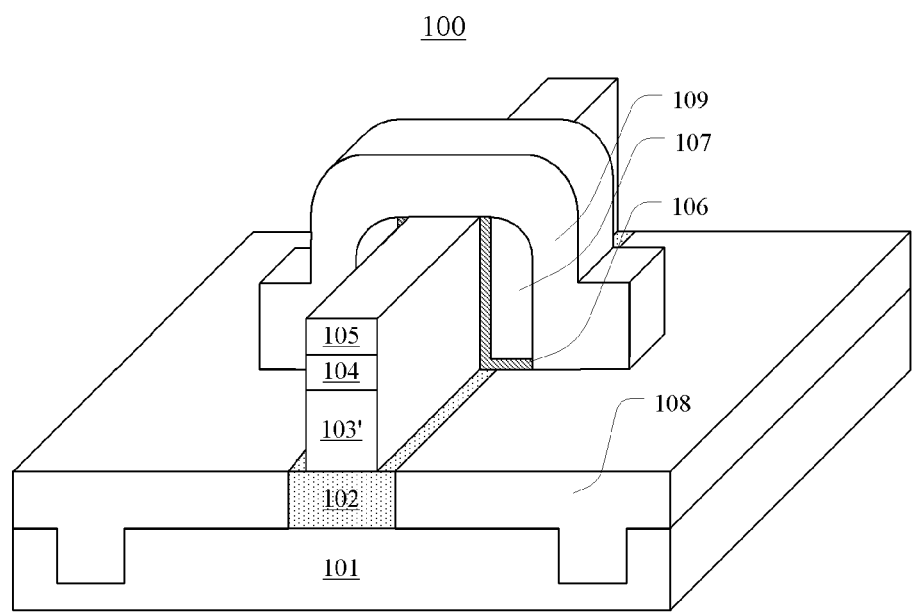
FIG. 24 is a perspective view of the resultant FinFET according to the present disclosure.

FIG. 24 is a perspective view of the FinFET formed by the above method according to the present disclosure. The FinFET 100 comprises a semiconductor substrate 101, a stress layer 102 on the semiconductor substrate 101, and a semiconductor fin 103' on the stress layer 102. The semiconductor fin 103' comprises two sidewalls extending in its length direction. The FinFET 100 further comprises a gate dielectric 103 on the two sidewalls of the semiconductor fin 103' and a gate conductor 109 on the gate dielectric 106. The FinFET 100 further comprises a source region (not shown) and a drain region (not shown) at two ends of the semiconductor fin 103'. The stress layer 102 extends below and in parallel with the semiconductor fin 103', and the stress layer 102 applies a stress to the semiconductor fin 103' in the length direction of the semiconductor fin 103'. The stress layer 102 has a shape similar to that of the semiconductor fin 103', with a first dimension in a length direction of the semiconductor fin 103' and a second dimension in a width direction of the semiconductor fin 103'. The first dimension is larger than the second dimension. A shallow trench isolation is used for defining the first dimension of the stress layer so that two ends of the stress layer 102 in the length direction of the semiconductor fin 103' adjoins the shallow trench isolation (not shown).

The insulating isolation layer 108 electrically isolates the gate conductor 109 from the semiconductor substrate 101, the stress layer 102 and the semiconductor fin 103'. Moreover, a portion of the insulating isolation layer 108 fills the shallow trench and is formed as the shallow trench isolation.

In FIG. 24, a threshold voltage adjustment layer 107 is shown between the gate dielectric 106 and the gate conductor 109 for adjusting a threshold voltage of the FinFET 100, and an oxide liner 104 and a nitride liner 105 are shown on the top surface of the semiconductor fin 103 for electrically isolating the semiconductor fin 103' from the gate conductor 109. However, these layers are only optional. If the FinFET 100 has an appropriate threshold voltage, the FinFET 100 may have no a threshold voltage adjustment layer 107. If the gate dielectric 106 is arranged on the top surface of the semiconductor fin 103', the FinFET 100 may have no an oxide liner 104 and a nitride liner 105.

The description is not to be considered as limiting the disclosure. Various modifications and applications may occur for those skilled in the art without departing from the true spirit and scope of the disclosure as defined by the appended claims.

We claim:

1. A method for manufacturing a FinFET, comprising:
forming a stress layer on a semiconductor substrate;
forming a semiconductor layer on the stress layer;
forming a semiconductor fin from the semiconductor layer, the semiconductor fin having two sidewalls extending in a lengthwise direction of the semiconductor fin;
forming a gate dielectric on the two sidewalls of the semiconductor fin;
removing an exposed portion of the stress layer under the gate dielectric by performing an anisotropic etching;
after removing the exposed portion of the stress layer, forming a shallow trench isolation which defines an active region of the FinFET and a first dimension of the stress layer, wherein the stress layer has two end surfaces at two ends in the lengthwise direction of the semiconductor fin, wherein the two end surfaces of the stress layer extend in a widthwise direction of the semiconductor fin, wherein the two end surfaces of the stress layer adjoin isolation;
after forming the shallow trench isolation, forming a gate conductor on the gate dielectric so that the gate dielectric is sandwiched between the gate conductor and the semiconductor fin, wherein a bottom of the gate conductor is self-aligned with an interface of the stress layer and the semiconductor fin; and
forming a source region and a drain region at two end surfaces of the semiconductor fin,
wherein the stress layer extends below and in parallel with the semiconductor fin, and
wherein the stress layer applies stress to the semiconductor fin in the lengthwise direction of the semiconductor fin.

2. The method according to claim 1, wherein the stress layer has the first dimension in a lengthwise direction of the semiconductor fin and a second dimension in a width direction of the semiconductor fin, and the first dimension is larger than the second dimension.

3. The method according to claim 2, wherein the second dimension of the stress layer is larger than a width of the semiconductor fin.

4. The method according to claim 2, wherein the first dimension of the stress layer extends in a lengthwise direction of the semiconductor fin, and wherein the two end surfaces of the stress layer adjoin two sidewalls of the shallow trench isolation in the widthwise direction of the semiconductor fin.

5. The method according to claim 1, wherein the step of etching the stress layer comprises:
removing a portion of the stress layer that is not covered by the semiconductor fin and the gate dielectric by anisotropic etching; and
removing a portion of the stress layer below the gate dielectric by isotropic etching to form an undercut.

6. The method according to claim 1, wherein after etching the stress layer and before forming the gate conductor, the method further comprises forming an insulating isolation layer which electrically isolates the gate conductor from the semiconductor substrate, the stress layer and semiconductor fin.

7. The method according to claim 1, wherein forming the semiconductor fin comprises:
forming a hard mask on the semiconductor layer; and
forming the semiconductor fin by etching the semiconductor layer through the hard mask.

8. The method according to claim 7, wherein the hard mask comprises an oxide liner on the semiconductor layer and a nitride liner on the oxide liner.

9. The method according to claim 1, wherein between the step of forming the gate dielectric and the step of forming the gate conductor, the method further comprises forming a threshold voltage adjustment layer between the gate dielectric and the gate conductor.

10. The method according to claim 1, wherein the semiconductor fin is made of Si, and the stress layer is made of one of SiGe and Si:C.

11. A FinFET, comprising:
a semiconductor substrate;
a stress layer on the semiconductor substrate;
a semiconductor fin on the stress layer, the semiconductor fin having two sidewalls extending in a lengthwise direction of the semiconductor fin;
a gate dielectric on the two sidewalls of the semiconductor fin;
a gate conductor on the gate dielectric, a bottom surface of the gate conductor and an interface between the stress layer and the semiconductor fin are substantially coplanar; and
a source region and a drain region at two ends of the semiconductor fin,
wherein the stress layer extends below and in parallel with the semiconductor fin, and applies stress to the semiconductor fin in the lengthwise direction of the semiconductor fin, wherein a shallow trench isolation is formed in a shallow trench, wherein the shallow trench isolation defines an active region of the FinFET and a first dimension of the stress layer in the lengthwise direction of the semiconductor fin, wherein the stress layer has two end surfaces at two ends of the stress layer in the lengthwise direction of the semiconductor fin, wherein the two end surfaces of the stress layer extend in a widthwise direction of the semiconductor fin, wherein the two end surfaces of the stress layer adjoin two sidewalls of the shallow trench isolation.

12. The FinFET according to claim 11, wherein the stress layer has the first dimension in the lengthwise direction of the semiconductor fin and a second dimension in a width direction of the semiconductor fin, and the first dimension is larger than the second dimension.

13. The FinFET according to claim 12, wherein the second dimension of the stress layer is larger than a width of the semiconductor fin.

14. The FinFET according to claim 11, further comprising an insulating isolation layer which electrically isolates the gate conductor from the semiconductor substrate and the stress layer.

15. The FinFET according to claim 14, wherein a portion of the insulating isolation layer is formed as the shallow trench isolation.

16. The FinFET according to claim 14, wherein a portion of the insulating isolation layer adjoins the stress layer below the gate dielectric.

17. The FinFET according to claim 11, further comprising a threshold voltage adjustment layer between the gate conductor and the gate dielectric.

18. The FinFET according to claim 11, wherein the semiconductor fin is made of Si, and the stress layer is made of one of SiGe and Si:C.

* * * * *